(12) United States Patent
Sato et al.

(10) Patent No.: US 6,630,748 B2
(45) Date of Patent: Oct. 7, 2003

(54) LOAD CONTROL APPARATUS AND METHOD HAVING SINGLE TEMPERATURE DETECTOR

(75) Inventors: Taketoshi Sato, Kariya (JP); Masao Yamada, Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/059,548

(22) Filed: Jan. 28, 2002

(65) Prior Publication Data

US 2002/0105769 A1 Aug. 8, 2002

(30) Foreign Application Priority Data

Feb. 6, 2001  (JP) ........................................ 2001-029642

(51) Int. Cl.[7] ................................................. B60L 1/00
(52) U.S. Cl. ........................ 307/10.1; 307/9.1; 307/117; 361/93.8
(58) Field of Search ................. 307/10.1, 117, 307/9.1; 361/93.8, 103, 49; 257/723, 724

(56) References Cited

U.S. PATENT DOCUMENTS

| | | | | |
|---|---|---|---|---|
| 4,841,164 A | * | 6/1989 | Basso ........................ 307/117 |
| 5,898,557 A | * | 4/1999 | Baba et al. ................. 361/103 |
| 5,923,135 A | | 7/1999 | Takeda | |
| 5,942,797 A | * | 8/1999 | Terasawa .................... 257/723 |
| 6,320,275 B1 | * | 11/2001 | Okamoto et al. .......... 307/10.1 |
| 6,373,671 B1 | * | 4/2002 | Watanabe et al. .......... 361/93.8 |
| 6,414,860 B1 | * | 7/2002 | Li ................................ 363/49 |
| 6,441,484 B2 | * | 8/2002 | Koyama et al. ............ 257/724 |

FOREIGN PATENT DOCUMENTS

| | | |
|---|---|---|
| JP | 7-50389 | 2/1995 |
| JP | 10-178738 | 6/1998 |
| JP | 2000-16198 | 1/2000 |

* cited by examiner

Primary Examiner—Gregory J. Toatley, Jr.
Assistant Examiner—Robert Deberadinis
(74) Attorney, Agent, or Firm—Harness, Dickey & Pierce, PLC

(57) ABSTRACT

A load control apparatus, in the form of a hybrid IC, comprises a microcomputer, control IC, and a plurality of MOS transistors. The control IC comprises only one temperature detection circuit for the MOS transistors. The MOS transistors and the temperature detection circuit are closely provided in thermally coupled manner. A temperature detected by the temperature detection circuit is compared with a predetermined threshold temperature for the purpose of detecting abnormal heat generation. When abnormal heat generation is detected, a current of each MOS transistor detected by a current detection circuit is compared with a predetermined threshold current for the purpose of detecting the MOS transistors under abnormal condition. The MOS transistor which is under the abnormal condition is exclusively controlled to protect other components.

30 Claims, 4 Drawing Sheets

LOAD CONTROL APPARATUS AND METHOD HAVING SINGLE TEMPERATURE DETECTOR

CROSS REFERENCE TO RELATED APPLICATION

This application is based on and incorporates herein by reference Japanese Patent Application No. 2001-29642 filed Feb. 6, 2001.

BACKGROUND OF THE INVENTION

The present invention relates to a load control apparatus and method with a plurality of switching components for driving a plurality of electrical loads.

A vehicle has various electrical loads including lamps and motors, and a load control apparatus with high current output capability to drive these loads. In a conventional load control apparatus, molded MOS power transistors with self-protection functions are mounted. If an excessive current flows due to a short in one of the loads, the power MOS transistor generating abnormal heat as a result of the excessive current is turned off. Therefore, an abnormal condition of one load has no impact on driving other loads.

However, the load control apparatus has limitations in terms of the size. Since each power MOS transistor included in the load control apparatus has a molding and is mounted on a printed circuit board, decreasing the size of the transistor is very limited, namely, decreasing the overall size of the load control apparatus is limited. As a result, it takes up a large portion of interior space of a vehicle. Moreover, the power MOS transistors with a self-protection function are very expensive. Therefore, cost issues become critical, especially when more power MOS transistors are required for more loads.

SUMMARY OF THE INVENTION

The present invention therefore has an objective to provide a relatively small and cost-effective load control apparatus and method that can protect a switching component causing abnormal heat generation.

According to the present invention, a load control apparatus detects heat generated by switching components by a single temperature detection circuit provided generally equidistantly from the switching components. Therefore, it is able to detect every temperature increase due to heat generation in any one of the components.

Preferably, the load control apparatus detects a current flowing in each switching component. If the load control apparatus has detected abnormal heat generation based on the detected temperature, it identifies which switching component generates the abnormal heat based on the detected current of each switching component. Then, it performs a protection control to the identified component. Therefore, the switching component generating an abnormal heat can be exclusively controlled to protect other components.

Since only one temperature detection circuit is required for a plurality of switching components, it is cost-effective. It is not necessary to integrate a switching component, a temperature detection circuit, and a current detection circuit into one chip. Therefore, the load control apparatus can be smaller in size than conventional load control apparatus.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiments of the present invention is explained with reference to various embodiments shown in the accompanying drawings.

[First Embodiment]

Figure 1:
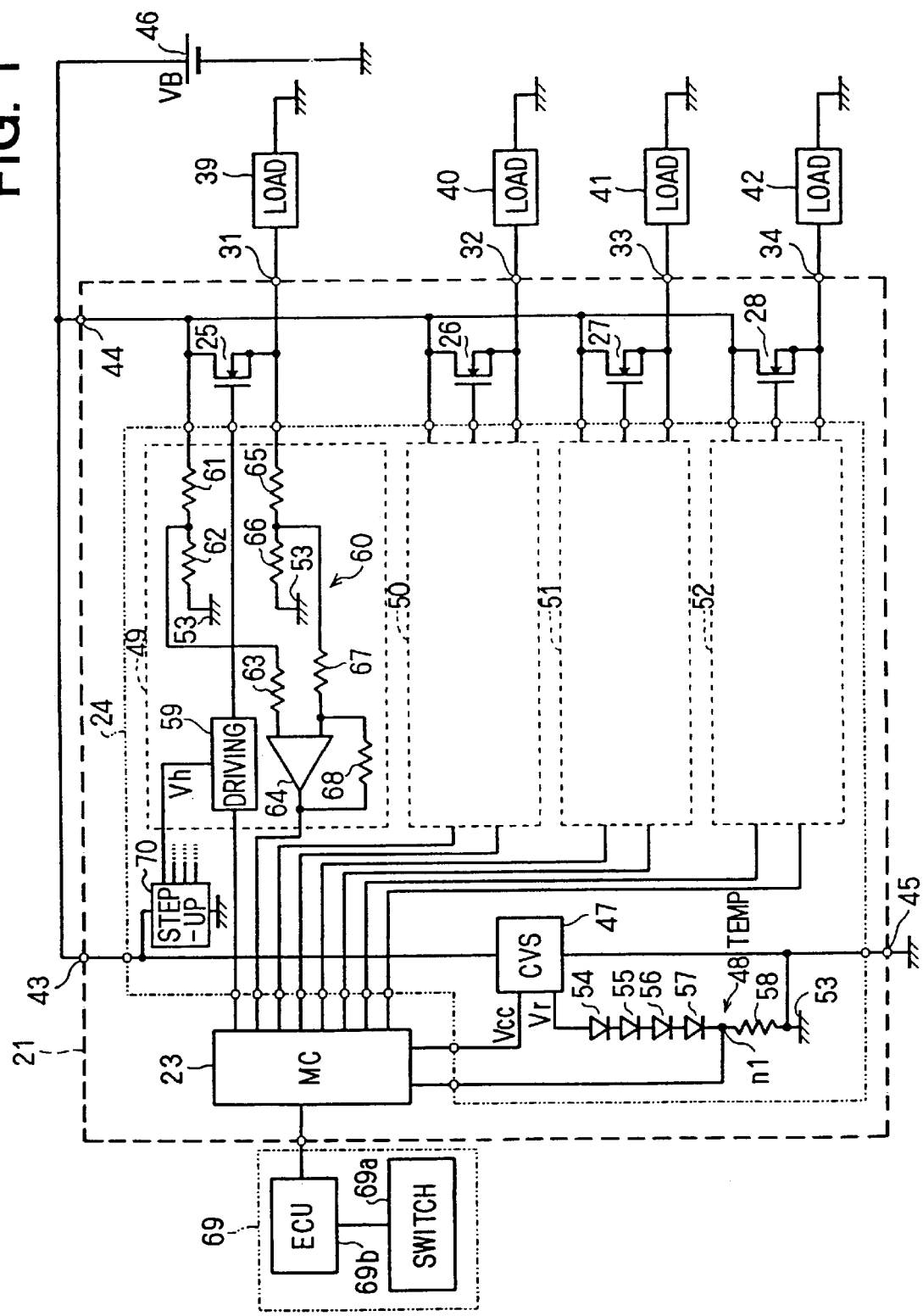
FIG. 1 is an electric wiring diagram showing a load control apparatus according to a first embodiment of the present invention.
Figure 2:
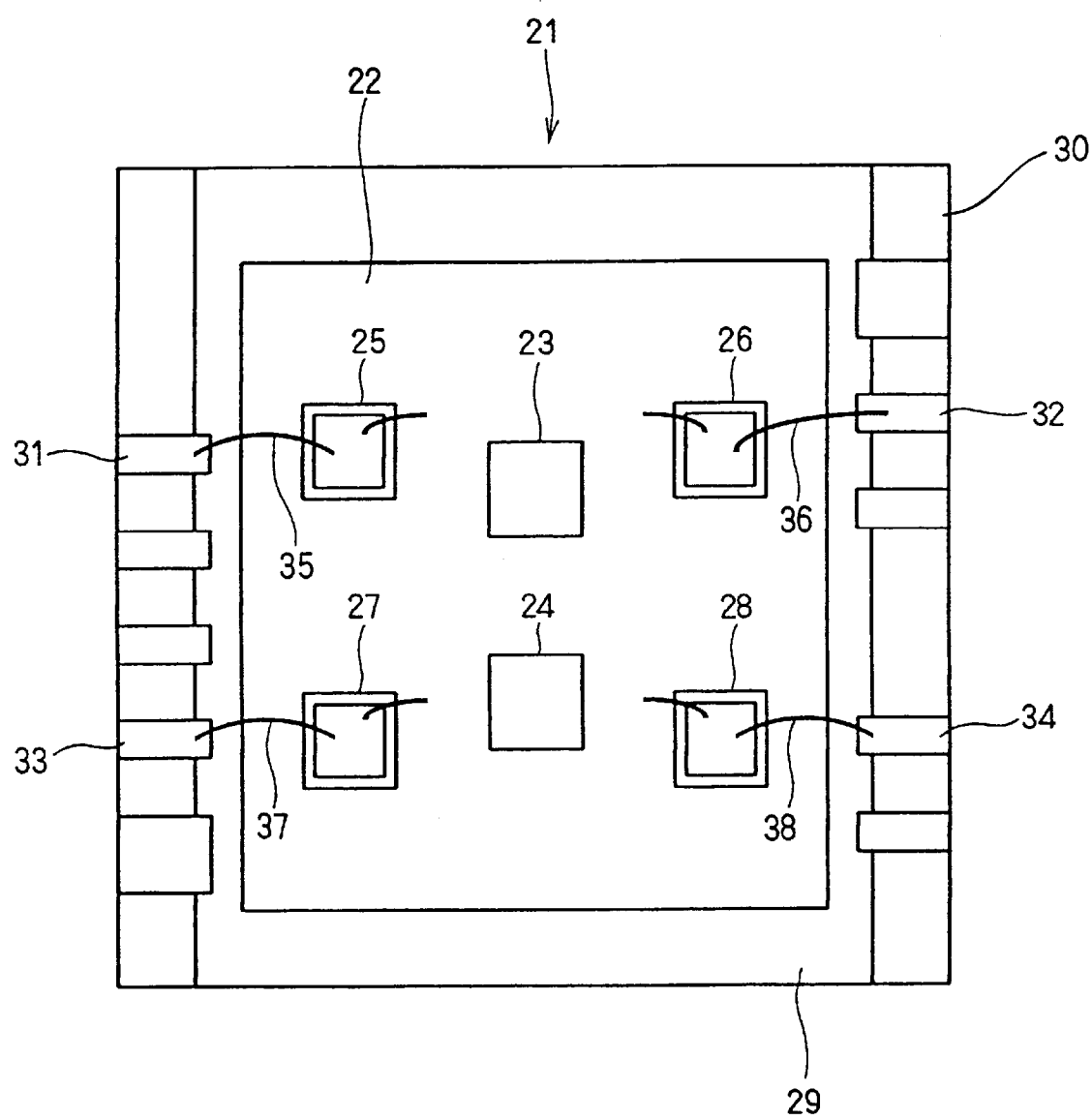
FIG. 2 is a top inside view of a load control apparatus shown in FIG. 1.

Referring to FIGS. 1 and 2, a load control apparatus comprises a hybrid IC 21, which drives electrical loads 39–42 such as windshield washer motor, horn, and front-end lighting devices including headlamps, fog lamps, and clearance lamps. It has an ability to output a sufficient current to drive these loads.

As shown in FIG. 2, a microcomputer (MC) 23, a control IC 24, MOS transistors 25–28 are mounted on a ceramic board 22. The control IC 24 and the MOS transistors 25–28 have close contact with the ceramic board 22 so that they are tightly connected in terms of thermal coupling. It is preferable to equidistantly space the MOS transistors 25–28 around the control IC 24.

The ceramic board 22 has a high thermal conductivity characteristic. It is bonded on an aluminum radiating plate 29 with a high thermal conductivity adhesive and installed in an insert case 30 made of are sin. The insert case 30 is equipped with a plurality of terminals including terminals 31–34. These terminals are connected to the ceramic board 22 or components mounted on the ceramic board 22 via bonding wires.

As shown in FIG. 1, the terminals 31–34 are connected to loads 39–42, respectively. Power supply terminals 43 and 44 are connected to a positive terminal of a battery 46, and a terminal 45 is connected to a negative terminal (vehicle chassis) of the battery 46. Drain-source of each n-channel MOS transistor 25–28, which acts as a hi-side switch, is connected between the power supply terminal 44 and its corresponding terminal 31–34. The other side of the terminals of the loads 39–42 are connected to the negative terminal of the battery 46.

The control IC 24 comprises driving control circuits 49–52 for the MOS transistors 25–28, respectively, as well as a constant voltage supply circuit (CVS) 47, a temperature detection circuit 48, and a voltage step-up circuit 70. Each driving control circuit 49–52 has a current detection circuit 60. Since the driving control circuits 49–52 have the same structures, only the circuit 49 is shown in detail.

The constant voltage supply circuit 47, which is configured as a band gap regulator for example, generates a reference voltage Vr. Temperature variation of the voltage Vr is very small. The temperature detection circuit 48 is connected between the output terminal of the constant voltage supply circuit 47 and a ground 53. The temperature detection circuit 48 comprises silicon diodes 54–57, and a resistor 58, all connected in series. The diodes 54–57 have the polarity indicated in FIG. 1 and the resistor 58 has a small temperature variation rate. A connection node n1 where the diode 57 and the resistor 58 are connected corresponds to the output node of the temperature detection circuit 48. The node n1 is connected to an input terminal of the microcomputer 23. The constant voltage supply circuit 47 generates power supply voltage Vcc for driving the microcomputer 23.

The voltage step-up circuit 70 has an input voltage VB supplied by the battery 46, and steps it up to a voltage Vh which is higher than a threshold voltage VTH for the MOS transistors 25–28. The voltage Vh is inputted to a driving circuit 59, which is a part of the driving control circuit 49. The driving circuit 59 applies a voltage to the gate of the transistor 25 in accordance with a driving signal from the microcomputer 23.

The current detection circuit 60 detects a drain-source voltage of the MOS transistor 25 and outputs it to an input terminal of the microcomputer 23. Resistors 61 and 62 for a voltage division are connected in series between the drain of the MOS transistor 25 and the ground 53. The voltage dividing point is connected to a noninverting input terminal of an operational amplifier 64 via a resistor 63. Resistors 65 and 66 for a voltage division are connected in series between the source of the MOS transistor 25 and the ground 53. The voltage dividing point is connected to a inverting input terminal of an operational amplifier 64 via a resistor 67. A resistor 68 is connected between the inverting input terminal and the out put terminal of the operational amplifier 64. Resistances of these resistors are predetermined so that the current detection circuit 60 precisely detects the drain-source voltage (an ON voltage) of the MOS transistor 25. The drain-source voltage becomes an ON voltage while the MOS transistor 25 is turned on. The ON voltage increases as a drain current flowing in the MOS transistor 25 increases.

Although not shown in FIG. 1, the microcomputer 23 for a protection control comprises a CPU, a RAM, a ROM storing a control program, an A/D converter, and I/O ports. The microcomputer 23 is driven with a power supply voltage Vcc supplied by the constant voltage supply circuit 47. An onboard combination switch ECU 69 is connected to the microcomputer 23. The combination switch ECU 69 comprises a combination switch 69a in which driving switches for loads 39–42 are combined, and an electronic control unit (ECU) 69b. The ECU 69b outputs an identifying signal to identify which load to drive depending upon the condition of the combination switch 69a which is operated by a driver.

The process performed by the microcomputer 23 is executed according to the control program stored in the ROM. The microcomputer 23 identifies which load to drive based on the identifying signal from the combination switch ECU 69 and outputs a driving command signal, ON or OFF, to the driving control circuits 49–52. The driving circuit 59 receives the voltage Vh. For an ON driving command signal, the driving circuit 59 receives the stepped-up voltage Vh and applies a gate voltage higher than the sum of the battery voltage VB and the threshold voltage VTH of the MOS transistor 25. For an OFF driving command signal, it outputs the gate voltage of 0 v.

The microcomputer 23 converts the output voltages of the temperature detection circuit 48 and the current detection circuits in the driving control circuits 49–52 to digital data by an internal A/D converter. The temperature detection circuit 48 detects heat generated by the MOS transistors 25–28 all at once because good heat conduction is provided between the circuit 48 and the MOS transistors 25–28. The temperature detection circuit 48 detects temperatures utilizing a temperature characteristic (–2 mV/° C.) of the forward voltage VF of the diodes 54–57. The voltage at the node n1 increases as the temperature increases. The current detection circuit 60 detects the ON voltage of the MOS transistor 25. Its output voltage increases as the drain current of the MOS transistor 25 increases.

The microcomputer 23 compares the detected temperature T and the detected current I with a predetermined threshold temperature Ta and predetermined threshold currents Ia and Ib, respectively. These threshold values are set for the microcomputer 23 to start protection control operation for the loads 39–42 so that a driving of each load is disabled. The threshold currents Ia and Ib are independently set for each MOS transistor 25–28.

The detected currents of the MOS transistors 25–28 are smaller than the threshold currents Ia and Ib when the hybrid IC 21 and the loads 39–42 are in normal operation. Although a drain loss occurs in the MOS transistors 25–28, heat generated by the drain loss is relatively small and the heat is sufficiently dissipated by the radiation plate 29. Therefore, the detected temperature T is smaller than the threshold temperature Ta in normal operation. As a result, the microcomputer 23 maintains normal control operations rather than starting protection control operations.

Figure 3:
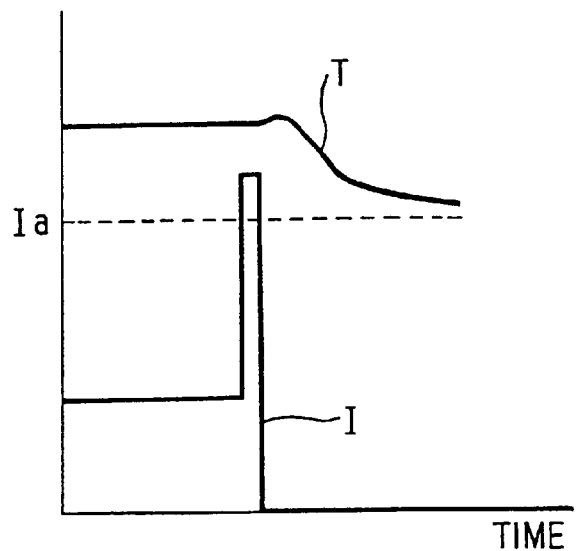
FIG. 3 is an operational diagram showing variations in detected temperature T and detected current I in the case of a complete short occurring in a load.

The detected temperature T and the detected current I of the MOS transistor 25 (load 39) in the case of a complete short (a dead short) in the load 39 or a motor lock are shown in FIG. 3. In this case, the detected current I surges up more than ten times larger than its normal condition. Therefore, a protection level that the MOS transistor 25 can be tolerated against a surging current is set as the threshold current Ia.

The microcomputer 23 turns off the MOS transistor 25 through the driving circuit 59 immediately (within tens to hundreds of milliseconds) after the detected current I exceeds the threshold current Ia. Although the drain loss of the MOS transistor 25 increases due to the excessive current, an increase in the detected temperature T delays due to a delay of heat conduction between the MOS transistor 25 and the control IC 24. Therefore, the microcomputer 23 turns off the MOS transistor 25 in response to the detected current regardless of the detected temperature T.

Figure 4:
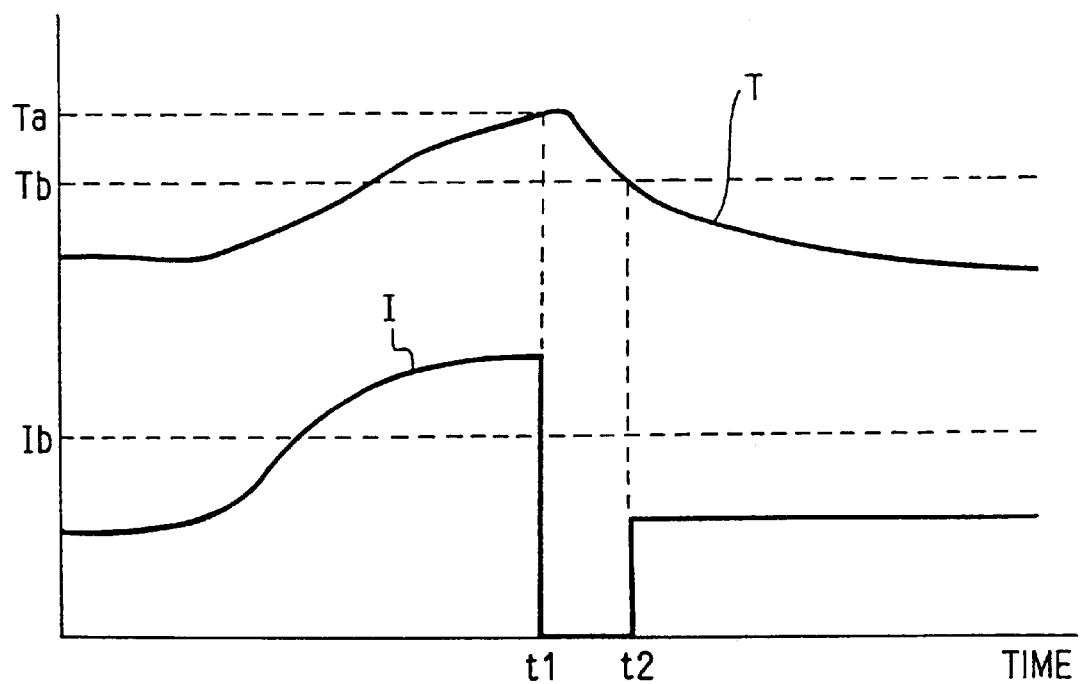
FIG. 4 is an operational diagram showing variations in detected temperature T and detected current I in the case of a partial short occurring in a load.

A detected temperature T and a detected current I of the MOS transistor 25 (load 39) in the case of a partial short (a rare short) in the load 39 or an increase in motor torque (a half lock) is shown in FIG. 4. In this case, the detected current I is smaller than the threshold current Ia and gradually increases after exceeding its normal current level. Therefore, the MOS transistor 25 may fail soon or later due to heat generation if it remains turned on. The MOS transistor 25 and the control IC 24 are thermally coupled via the ceramic board 22, thus, the detected temperature T gradually increases as heat generation in the MOS transistor increases.

The microcomputer 23 determines that one of the MOS transistors 25–28 generates abnormal heat at time t1 when the detected temperature T exceeds the threshold temperature Ta. Then, it determines whether the detected current I exceeds the threshold current Ib for each MOS transistor. The threshold current Ib should be set larger than the normal current and smaller than the threshold current Ia. It also should be set to the smallest current level (approximately 1.5 to 2 times larger than the normal current) that may cause failure if the current remains at the level. In the case of FIG. 4, the detected current of the transistor 25 exceeds the threshold current Ib at time t1 in reaction to an abnormal condition of the load 39. As a result, the microcomputer 23 turns off the MOS transistor 25 through the driving circuit 59.

The microcomputer 23 has hysteresis in a comparison between the detected temperature T and the threshold temperature. Once the detected temperature T exceeds the threshold temperature Ta, the microcomputer 23 reduces the threshold temperature from Ta to Tb. The microcomputer 23 turns on the MOS transistor 25 when the detected temperature T falls under the threshold temperature Tb after heat generation of the MOS transistor 25 has stopped. As a result, the microcomputer 23 returns to normal control operation when the load 39 is recovered from the abnormal condition. When the load 39 remains in the abnormal condition, the normal and protection control operations are repeated to prevent a temperature increase in the MOS transistor 25, resulting in prevention of a temperature increase in the hybrid IC 21.

According to the hybrid IC 21 of the present embodiment, the temperature detection circuit 48 has an ability to detect every temperature increase in any one of the MOS transistors 25–28. It is because the MOS transistors 25–28 that drive the loads 39–42 and the control IC 24 that comprises the temperature detection circuit 48 are thermally coupled via the ceramic board 22. The microcomputer 23 detects abnormal heat generation based on the fact that the detected temperature T exceeds the threshold temperature Ta, and starts the protection control operation for the MOS transistor in which a larger current than the threshold current Ib flows, determining it as the cause of the abnormal heat generation. The protection control operation in this embodiment turns off the MOS transistor that is determined as the cause of the heat generation.

Even if an abnormal condition occurs in any one of the loads 39–42, the load that is the cause of the abnormal heat generation can be exclusively controlled to prevent an overall abnormal temperature increase in the hybrid IC 21. Moreover, heat generation in the MOS transistors 25–28 are dissipated by the radiation plate 29. Therefore, the temperature increase in the hybrid IC 21 is more controlled while the MOS transistors 25–28 and the temperature detection circuit 48 remain thermally coupled. Because the hybrid IC 21 is able to keep driving loads 39–42 in normal condition, it is especially suitable for driving lighting devices, windshield washer motors, and horns, essentials for safe driving.

The microcomputer 23 immediately turns off the MOS transistor 25–28 regardless of the detected temperature T when each detected current I in the MOS transistor 25–28 exceeds the threshold current Ia. Therefore, it is able to protect the MOS transistors 25–28 from a surging current due to a complete short or other failures occurring in the loads 39–42.

Moreover, the protection control performed by the microcomputer 23 is guaranteed since the threshold temperatures Ta and Tb have hysteresis. Since the current detection circuit 60 detects ON voltages at the MOS transistors 25–28, it is able to detect not only the level of current but also an abnormal increase in ON voltages due to insufficient gate voltages.

The size of the hybrid IC 21 is very small compared to a conventional load control apparatus. It is also cost-effective since only one temperature detection circuit 48 is required for a plurality of MOS transistors 25–28. In the hybrid IC 21, the MOS transistors 25–28 are easy to thermally couple with the single temperature detection circuit 48 because they are closely mounted each other. Moreover, the thermal coupling between the MOS transistors 25–28 and the temperature detection circuit 48 which is a part of the control IC 21 is enhanced because they are mounted on the ceramic board 22 that has high heat conductivity.

[Second Embodiment]

Figure 5:
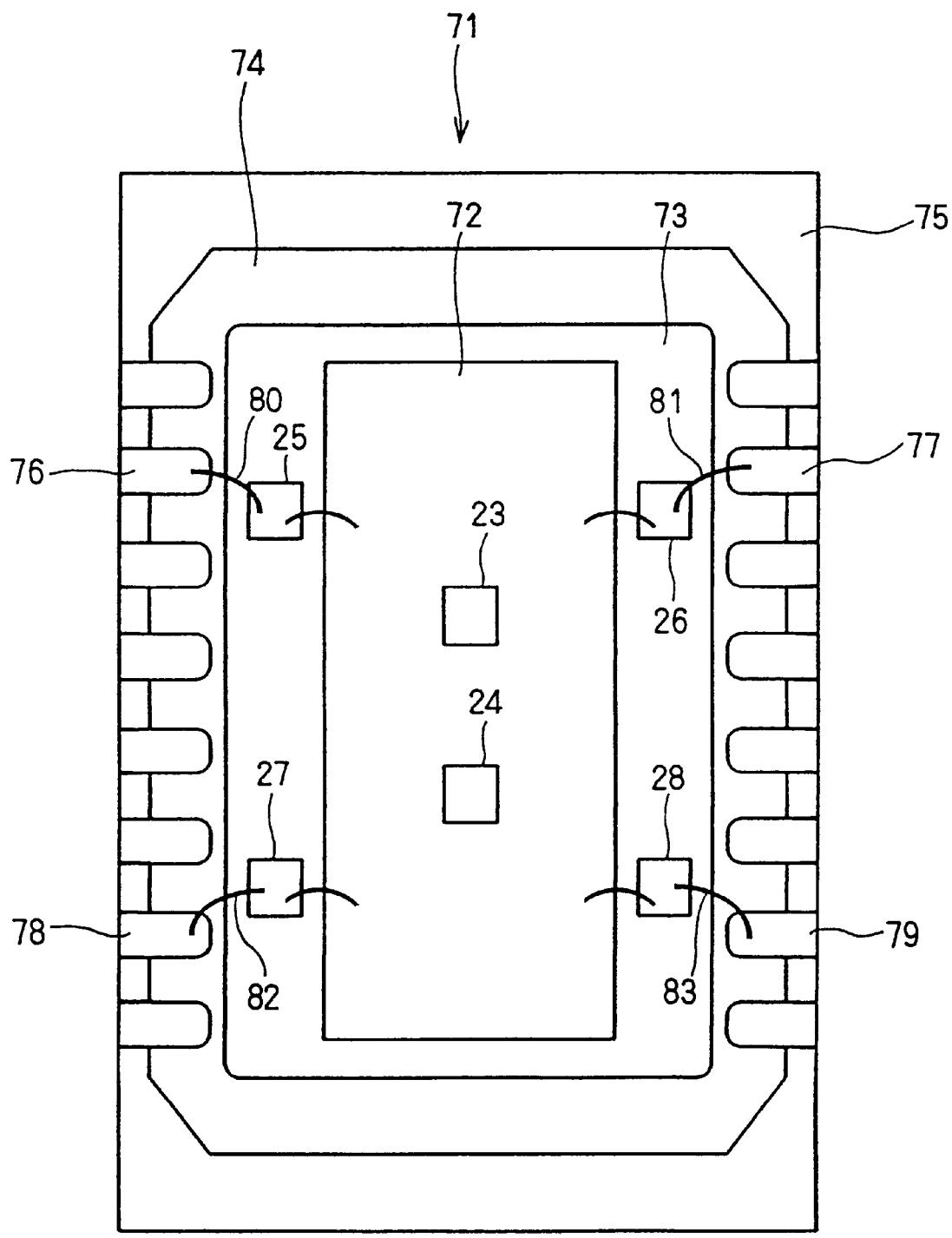
FIG. 5 is a top inside view of a load control apparatus according to a second embodiment of the present invention.

Referring to FIG. 5, a hybrid IC 71 has the same electric structure as the hybrid IC 21 of the first embodiment. The hybrid IC 71 also has the microcomputer 23, control IC 24, and MOS transistors 25–28.

The microcomputer 23 and the control IC 24 are mounted on the top layer of a ceramic board 72. The ceramic board 72 is bonded onto a lead frame of the hybrid IC 71 with high thermal conductivity adhesive. Around the ceramic board 72, the MOS transistors 25–28 are soldered onto the lead frame 73 that carries the voltage of VB.

The control IC 24 and the ceramic board 72, the ceramic board 72 and the lead frame 73, and the MOS transistors 25–28 and the lead frame 73 are thermally coupled, respectively. The lead frame 73 is molded with a resin. A package 74 is mounted on an aluminum radiation plate 75. The ceramic board 72, components mounted on the ceramic board 72, the MOS transistors 25–28, terminals 76–79 of the lead frame 73 are bonded together with bonding wires 80–83.

According to the hybrid IC 73, the temperature detection circuit 48 is able to detect every increase in temperature due to heat generation in anyone of the MOS transistor 25–28. It is because the MOS transistors 25–28 and the control IC 24 that includes the temperature detection circuit 48 are thermally coupled via the lead frame 73 and the ceramic board 72. Therefore, the same effects as in the first embodiment can be gained in this embodiment. An increase in temperature due to a drain loss can be controlled since heat generated in the MOS transistors 25–28 are also dissipated through the lead frame 73.

[Other Embodiment]

The present invention should not be limited to the embodiments previously discussed and shown in the figures, but may be implemented in various ways as follows without departing from the spirit of the invention.

In the first and second embodiments, the ceramic board 22 and 72, the microcomputer 23, and the control IC 24 can be connected by wire bonding or flip-chip. Lead welding can be used for connecting with the terminals of the insert case 30 or of the lead frame 73.

It may be preferable to have the microcomputer 23 perform a PWM control instead of an ON/OFF control when a light dimmer is required for a lamp load. In this case, the microcomputer 23 can perform a protection control by reducing a duty ratio of the PWM control rather than turning off the MOS transistors 25–28. This can maintain a current feeding to the load under an abnormal condition although the amount of the current is reduced.

In the first and the second embodiments, the microcomputer 23 and the control IC 24 are composed in separated chips. They can be integrated into one chip. This reduces the size of a board on which the IC chip mounted. Therefore, the overall size and cost can be reduced as well.

Bipolar transistors or IGBTs can be used for switching components. These switching components can be connected so that they operates as low-side switches instead of high-side switches.

The threshold currents Ia and Ib can be set to have respective hystereses. This stabilizes protection controls.

The microcomputer 23 can be configured to send diagnostic signals to the onboard combination switch ECU 69 or a service center while maintaining an OFF driving of the MOS transistor when it has consecutively performed protection controls to the specific MOS transistor for predetermined number of times. A driver or service personnel can recognize a failure through this operation.

The temperature detection circuit 48 can be installed more than one as long as they are able to detect heat generated in the MOS transistors 25–28 all at once and output the result of the heat detection to the microcomputer 23.

In the above embodiments, the protection control operation may not start even if the detected temperature T exceeds the threshold temperature Ta. An example of such a case is when some of the MOS transistors 25–28 continue passing currents close to but never exceeding the threshold current Ib. In this case, temperatures of the electrical loads 39–42 continue to rise, and the loads 39–42 may break down. If a number of electrical loads are installed, the protection control may not be sufficient enough to protect those loads.

To provide more reliable protection control, another threshold temperature higher than Ta may be provided. This threshold temperature is set slightly under the level that the electrical loads 39–42 can tolerate for turning off all the switching components when the detected temperature exceeds it. The electrical loads 39–42 can be turned off on a priority basis.

As an advanced application of setting different levels of threshold temperature, setting a plurality of threshold temperatures is also possible. These threshold temperatures are set based on a distribution of temperature increases in an actual product. Loads and their corresponding thresholds are defined so that operation of the loads that need to be controlled at the level of the detected temperature will be exclusively controlled.

What is claimed is:

1. A load control apparatus for controlling driving of a plurality of electrical loads, comprising:
    a plurality of switching components for driving the loads, respectively;
    a temperature detection means for detecting heat generated in the switching components at one location;
    a current detection means for detecting currents flowing in the switching components; and
    a protection control means for detecting a switching component causing abnormal heat generation and controlling it for protection based on a temperature detected by the temperature detection means and currents flowing in the loads detected by the current detection means, wherein the protection control means controls a current flowing in the switching component determined as the cause of abnormal heat generation by turning off the component or performing a PWM control.

2. A load control apparatus as in claim 1, wherein the temperature detection means is closely provided and thermally coupled with the switching components.

3. A load control apparatus as in claim 1, wherein the temperature detection means determines the switching component as the cause of abnormal heat generation when the detected temperature exceeds a threshold temperature and a detected current in the switching component exceeds its first threshold current.

4. A load control apparatus as in claim 3, wherein the protection control means immediately turns off the switching component when the detected current exceeds a second threshold current lager than the first threshold current irrespective of the detected temperature.

5. A load control apparatus as in claim 3, wherein the threshold temperature and the threshold current have respective hystereses.

6. A load control apparatus as in claim 1, wherein the current detection means is provided generally equidistantly from the switching components in thermally conductive manner.

7. A load control apparatus for controlling driving of a plurality of electrical loads, comprising:
    a plurality of switching components for driving the loads, respectively;
    a temperature detection means for detecting heat generated in the switching components at one location;
    a current detection means for detecting currents flowing in the switching components; and
    a protection control means for detecting a switching component causing abnormal heat generation and controlling it for protection based on a temperature detected by the temperature detection means and currents flowing in the loads detected by the current detection means,
    wherein the switching components, temperature detection means, current detection means, and protection control means are integrated in the form of a hybrid IC.

8. A load control apparatus as in claim 7, wherein chips of the switching components and a chip including the temperature detection means are mounted on a high thermal conductivity board in the hybrid IC.

9. A load control apparatus as in claim 8, wherein the high thermal conductivity board is a ceramic board.

10. A load control apparatus as in claim 7, wherein chips of the switching components are mounted on a lead frame and a chip including the temperature detection means is mounted on a high thermal conductivity board which is thermally coupled with the lead frame.

11. A load control apparatus as in claim 10, wherein the high thermal conductivity board is a ceramic board.

12. A load control apparatus as in claim 7, wherein a radiation plate for dissipating heat generated in the switching components is provided in the hybrid IC.

13. A load control apparatus as in claim 7, wherein the temperature detection means is closely provided and thermally coupled with the switching components.

14. A load control apparatus as in claim 7, wherein the temperature detection means determines the switching component as the cause of abnormal heat generation when the detected temperature exceeds a threshold temperature and a detected current in the switching component exceeds its first threshold current.

15. A load control apparatus as in claim 14, wherein the protection control means immediately turns off the switching component when the detected current exceeds a second threshold current lager than the first threshold current irrespective of the detected temperature.

16. A load control apparatus as in claim 14, wherein the threshold temperature and the threshold current have respective hystereses.

17. A load control apparatus as in claim 7, wherein the current detection means is provided generally equidistantly from the switching components in thermally conductive manner.

18. A protection control method for a plurality of electrical loads connected to a load control apparatus, which includes a plurality of switching components for the electrical loads, the method comprising the steps of:
    detecting temperatures of switching components by a single temperature detection means mounted generally equidistantly from each of the switching components; and
    disabling operation of at least one of the switching components when the detected temperature exceeds a predetermined threshold temperature.

19. A protection control method as in claim 18, further comprising the steps of:

detecting a current of each switching component; and comparing the current of each switching component with a first predetermined threshold current and a second predetermined threshold current smaller than the first threshold current, wherein the disabling step disables the switching component when the detected current exceeds the first threshold current irrespective of the detected temperature, and when the detected current exceeds only the second threshold current and the detected temperature exceeds the threshold temperature.

20. A protection control method as in claim 19, further comprising the steps of:

switching the threshold temperature down to a lower threshold temperature; and switching the first and the second threshold currents to respective lower threshold currents when the detected current exceeds the first and the second threshold currents, respectively.

21. A protection control method according to claim 18, wherein the single temperature detection means is mounted generally equidistantly from each of the switching components by being positioned generally at a center of a frame line formed by connecting positions of the switching components.

22. A load control apparatus for controlling driving of a plurality of electrical loads, comprising:

a plurality of switching components for driving the loads, respectively;

a temperature detection means for detecting heat generated in the switching components at one location;

a current detection means for detecting currents flowing in the switching components; and a protection control means for detecting a switching component causing abnormal heat generation and controlling it for protection based on a temperature detected by the temperature detection means and currents flowing in the loads detected by the current detection means, wherein the temperature detection means, the current detection means, and the protection control means are all provided in a same chip.

23. A load control apparatus as in claim 22, wherein the temperature detection means is closely provided and thermally coupled with the switching components.

24. A load control apparatus as in claim 22, wherein the temperature detection means determines the switching component as the cause of abnormal heat generation when the detected temperature exceeds a threshold temperature and a detected current in the switching component exceeds its first threshold current.

25. A load control apparatus as in claim 24, wherein the protection control means immediately turns off the switching component when the detected current exceeds a second threshold current lager than the first threshold current irrespective of the detected temperature.

26. A load control apparatus as in claim 24, wherein the threshold temperature and the threshold current have respective hystereses.

27. A load control apparatus as in claim 22, wherein the current detection means is provided generally equidistantly from the switching components in thermally conductive manner.

28. A load control apparatus according to claim 22, wherein the switching components, the temperature detection means, the current detection means and the protection control means are integrated in the form of a hybrid IC.

29. A load control apparatus for controlling driving of a plurality of electrical loads, comprising:

a plurality of switching components for driving the loads, respectively;

a temperature detection means for detecting heat generated in the switching components at one location;

a current detection means for detecting currents flowing in the switching components; and a protection control means for detecting a switching component causing abnormal heat generation and controlling it for protection based on a temperature detected by the temperature detection means and currents flowing in the loads detected by the current detection means, wherein the switching components, the temperature detection means, the current detection means, and the protection control means are integrated in a hybrid IC having external terminals, the switching components are located at a first region of the integrated hybrid IC, whereas the temperature detection means, current detection means, and the protection control means are located at a second region in the integrated hybrid IC, wherein said first region is in a position between the external terminals and said second region.

30. A load control apparatus according to claim 29, the first region is located in an outer side of the hybrid IC as compared to the second region.

* * * * *